(12) United States Patent
Okushima et al.

(10) Patent No.: US 8,395,234 B2
(45) Date of Patent: Mar. 12, 2013

(54) SEMICONDUCTOR DEVICE

(75) Inventors: Mototsugu Okushima, Kanagawa (JP); Takasuke Hashimoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 165 days.

(21) Appl. No.: 12/844,303

(22) Filed: Jul. 27, 2010

(65) Prior Publication Data

US 2011/0049672 A1 Mar. 3, 2011

(30) Foreign Application Priority Data

Aug. 25, 2009 (JP) ................................. 2009-194467

(51) Int. Cl.
*H01L 27/08* (2006.01)
(52) U.S. Cl. ................. 257/531; 257/E27.013; 361/361
(58) Field of Classification Search .................. 257/531; 361/56
See application file for complete search history.

(56) References Cited

U.S. PATENT DOCUMENTS

| | | | |
|---|---|---|---|
| 6,597,227 B1 * | 7/2003 | Yue et al. ...................... | 327/310 |
| 2007/0296055 A1 * | 12/2007 | Yen et al. ...................... | 257/531 |
| 2011/0248811 A1 * | 10/2011 | Kireev .......................... | 336/200 |

FOREIGN PATENT DOCUMENTS

| | | |
|---|---|---|
| JP | 2009-64923 A | 3/2009 |
| JP | 10-173133 A | 6/2010 |

OTHER PUBLICATIONS

Vassilev et al., "ESD—RF co-design methodology for the state of the art RF-CMOS blocks" Elsevier, Microelectronics Reliability 45 (2005) 255-268.*
Sherif Galal et al, 40-Gb/s Amplifier and ESD Protection Circuit in 0.18-μm CMOS Technology, IEEE Journal of Solid-State Circuits, Dec. 2004, pp. 2389-2396, vol. 39, No. 12.
Sherif Galal et al, Broadband ESD Protection Circuits in CMO Technology, IEEE International Solid State Circuits Conference 2003, Session 10, High Speed Building Blocks, Paper 10.5, 20 pages.
Edward Pilliai et al., Novel T-Coil Structure and Implementation in a 6.4-Gb/s SMOS Receiver To Meet Return Loss Specifications, Electronic Components and Technology Conference, 2007, pp. 147-153.
Dennis Feucht, Handbook of Analog Circuit Design, Academic, 1990, 5 pages.

* cited by examiner

*Primary Examiner* — A. Sefer
(74) *Attorney, Agent, or Firm* — Foley & Lardner LLP

(57) ABSTRACT

A semiconductor device has: a signal pad; a power supply line; a ground line; an inductor section whose one end is connected to the signal pad; a terminating resistor connected between the other end of the inductor section and the power supply line or the ground line. The semiconductor device further has: a first ESD protection element connected to a first node in the inductor section; and a second ESD protection element connected to a second node whose position is different from that of the first node in the inductor section.

7 Claims, 10 Drawing Sheets

SEMICONDUCTOR DEVICE

INCORPORATION BY REFERENCE

This application is based upon and claims the benefit of priority from Japanese patent application No. 2009-194467, filed on Aug. 25, 2009, the disclosure of which is incorporated herein in its entirety by reference.

BACKGROUND OF THE INVENTION

1. Field of the Invention

The present invention relates to a semiconductor device provided with an ESD (ElectroStatic Discharge) protection element.

2. Description of Related Art

An impedance matching technique by using a bridged T-coil is known (refer to, for example, Non-Patent Document 1: "40-Gb/s Amplifier and ESD Protection Circuit in 0.18-μm CMOS Technology", Sherif Galal, Behzad Razavi, IEEE Journal of Solid-State Circuits VOL. 39, No. 12, pp. 2389-2396, December 2004). In a high-speed interface circuit provided with an ESD protection element, a parasitic capacitance of the ESD protection element and a parasitic capacitance of an input/output circuit affect impedance matching ability. In particular, impedance mismatch from a desired impedance (50Ω) is caused in a high-frequency region. The impedance matching by using the T-coil is a technique for preventing the impedance mismatch, namely cancelling the parasitic capacitance over a wide frequency range.

FIG. 1 is a circuit diagram showing a typical interface circuit provided with a T-coil and an ESD protection element. The interface circuit shown in FIG. 1 has a signal input pad 1, a signal line 2, a power supply line 3, a ground line 4, a tap interconnection 5, a T-coil section 10, a terminating resistor 12, an ESD protection element section 20 and a power ESD clamp circuit 30. The power supply line 3 supplies a power supply potential VDD. The ground line 4 supplies a ground potential GND.

The signal input pad 1 is used for inputting an external signal. The signal line 2 connected to the signal input pad 1 transmits the input signal. The T-coil section 10 has an inductor section 11 and a capacitor $C_B$. The inductor section 11 has inductors L1 and L2. The capacitor $C_B$ is a bridging capacitor of the inductors L1 and L2. A parameter "k" is a coupling coefficient between the inductors L1 and L2. One end of the inductor L1 is connected to the signal line 2, and one end of the inductor L2 is connected to the terminating resistor 12. The other ends of the inductor L1 and the inductor L2 are connected to a center tap A. The tap interconnection 5 is connected to the center tap A. The tap interconnection 5 connects the T-coil section 10 and the ESD protection element section 20. One end of the terminating resistor 12 is connected to the inductor section 11, and the other end thereof is connected to the power supply line 3. It should be noted that the terminating resistor 12 may be connected to the ground line 4 instead of the power supply line 3.

The ESD protection element section 20 has an ESD protection element ESD_G (hereinafter referred to simply as ESD_G) and an ESD protection element ESD_V (hereinafter referred to simply as ESD_V). One end of the ESD_G is connected to the ground line 4 through an interconnection 21, and the other end thereof is connected to a connection point B. One end of the ESD_V is connected to the power supply line 3 through an interconnection 22, and the other end thereof is connected to the connection point B. The connection point B is further connected to the above-mentioned tap interconnection 5 and an internal circuit. The power ESD clamp circuit 30 is connected between the power supply line 3 and the ground line 4, and provides an ESD discharge path between the power supply line 3 and the ground line 4. Let r1, r2 and r3 be respective parasitic resistances of the tap interconnection 5, the interconnection 21 and the interconnection 22. It should be noted that a discharge path 100 shown in FIG. 1 corresponds to a case where ESD having a positive potential as compared with the ground potential GND is input to the signal input pad 1.

In the typical interface circuit, as shown in FIG. 1, the tap interconnection 5 connecting the T-coil section 10 to the ESD protection element section 20 is drawn only from a single point, the center tap A in the inductor section 11 (refer to, for example, Non-Patent Document 2: "Broadband ESD Protection Circuits in CMOS Technology", Sherif Galal, Behzad Razavi, ISSCC 2003, Session 10, High Speed Building Blocks, Paper 10.5; and Non-Patent Document 3: "Novel T-Coil Structure and Implementation in a 6.4-Gb/s CMOS Receiver to Meet Return Loss Specifications", Pillai Edward, Weiss Jonas, Electronic Components and Technology Conference 2007, Proceedings, 57th, pp. 147-153). The reason is to correctly reflect design parameters (L1, L2, $C_B$ and k in FIG. 1) of the T-coil section 10 in a layout of the T-coil section 10 based on the CMOS process. The layout of the T-coil section 10 is determined as follows. First, the design parameters of the T-coil section 10 are calculated. The design parameters are calculated based on a parasitic capacitance value C_total to be canceled (including ESD capacitance, gate capacitance of an input circuit and the like) and a desired impedance value Rs (e.g. 50Ω). Then, a metal interconnection of the inductor section 11 is laid-out in a spiral shape so as to achieve the calculated design parameters L1, L2, $C_B$ and k of the T-coil section 10. Here, a certain intermediate point of the inductor section 11 having the spiral shape is the center tap A, and the position of the center tap A is determined such that the calculated design parameters are achieved. Then, a node having the parasitic capacitance C_total is connected to the center tap A. In this manner, the impedance matching is achieved over a wide frequency range. To use the single center tap A for connecting the tap interconnection 5 may be important in correctly reflecting the design parameters of the T-coil section 10 in the layout of the T-coil section 10.

Equations for calculating the design parameters of the T-coil section 10 will be described below. FIG. 2 is a circuit diagram showing an interface circuit provided with a T-coil and a terminating resistor. In this case, the design parameters (inductances $L_1$ and $L_2$, bridging capacitance $C_B$, and coupling coefficient k) of the T-coil can be expressed by the following Equation (1) (for example, refer to the above-mentioned Non-Patent Document 2).

[Equation 1]

$$\begin{cases} L_1 = L_2 = \dfrac{C_L R_T^2}{4}\left(1 + \dfrac{1}{4\zeta^2}\right) \\ C_B = \dfrac{C_L}{16\zeta^2} \\ k = \dfrac{4\zeta^2 - 1}{4\zeta^2 + 1} \end{cases} \quad (1)$$

In the Equation (1), $C_L$ is the parasitic capacitance value C_total to be canceled (including ESD capacitance, gate capacitance of an input circuit and the like), $R_T$ is the terminating resistance value, and $\zeta$ is a coefficient depending on characteristics.

For example, in a case where there is a strong emphasis on the MFD (Maximally Flat group Delay), the following coefficient $\zeta$ is used.

[Equation 2]

$$\zeta = \frac{\sqrt{3}}{2} \quad (2)$$

In this case, the design parameters in the above Equation (1) can be expressed by the following Equation (3).

[Equation 3]

$$\begin{cases} C_B = \frac{1}{12} C_L \\ L_1 = L_2 = \frac{1}{3} R_T^2 C_L \\ k = \frac{1}{2} \end{cases} \quad (3)$$

For more details, please also refer to Non-Patent Document 4: "Handbook of Analog Circuit Design", Dennis Feucht, San Diego, Calif., Academic, 1990. As described above, the design parameters of the T-coil can be expressed by using the parasitic capacitance $C_L$, the terminating resistance value $R_T$ and the coefficient $\zeta$. Let us consider a case where the parasitic capacitance $C_L$=1 pF, the terminating resistor=50Ω and the coefficient $\zeta$ is as expressed by the above Equation (2). In this case, the bridging capacitance $C_B$ is calculated to be 83.3 fF, and the inductances $L_1$ and $L_2$ are calculated to be 0.833 nH. The layout of the inductor section 11 and the position of the center tap A are determined such that the calculated design parameters can be achieved. As a result, the parasitic capacitance of the ESD protection element and the parasitic capacitance of the input/output circuit can be canceled and the impedance matching is possible for a wide frequency range.

In the example shown in FIG. 1, a single-phase signal is input to an input circuit as the internal circuit connected to the T-coil section 10. The same applies to a case of an output circuit as the internal circuit connected to the T-coil section 10. Moreover, the same applies to a circuit that handles a differential signal instead of the single-phase signal. For example, an input circuit and an output circuit based on a differential configuration are disclosed in the FIG. 10.5.3 and the FIG. 10.5.4 of the above-mentioned Non-Patent Document 2. The impedance matching and ESD tolerability are achieved for a wide frequency range.

Semiconductor devices provided with an ESD protection circuit and an inductor are disclosed also in Japanese Patent Publication JP-H10-173133A and Japanese Patent Publication JP-2009-064923A.

The inventors of the present application have recognized the following points.

In the case of the configuration shown in FIG. 1, the CMOS internal circuit may be destroyed by a voltage increase due to an ESD current at a time when ESD is applied. Miniaturization of the CMOS process has been progressing, and a thickness of a metal interconnection particularly formed in the lower interconnect layer has been getting smaller. This causes increase in an interconnect resistance of the metal interconnection. For example, a sheet resistance of the metal interconnection is about 0.2Ω/sq. In this case, the interconnect resistance of a metal interconnection with a width of 1 µm and a length of 10 µm is about 2Ω. Meanwhile, a gate breakdown voltage of a MOS transistor in the internal circuit in a case of 40 nm CMOS process is about 4 V. Therefore, if the ESD current whose magnitude is 3 A flows through the metal interconnection at a time when ESD is applied, the voltage increase of about 6 V is caused. Such the voltage stress far exceeds the gate breakdown voltage of 4 V and is large enough to destroy the CMOS internal circuit.

As shown in FIG. 1, the ESD_V connected to the power supply line 3 and the ESD_G connected to the ground line 4 are necessary in the ESD protection element section 20. However, the tap interconnection 5 from the T-coil section 10 to the ESD protection element section 20 is drawn only from the single point, the center tap A in the inductor section 11. Therefore, routing of a metal interconnection (tap interconnection 5) from the single center tap A to both of the ESD protection elements ESD_V and ESD_G is required. In this case, the metal interconnect path becomes complicated and the metal interconnect length becomes large. This causes increase in a parasitic resistance of the metal interconnection to each ESD protection element, which results in destruction of the CMOS internal circuit by the voltage increase due to the ESD current.

Moreover, in the case of the configuration shown in FIG. 1, a current density in the discharge path at the time when ESD is applied is high, which causes fusing of a metal interconnection. A thickness of a metal interconnection in a case of 40 nm CMOS process has been decreased to about 0.1 µm. Meanwhile, the magnitude of the ESD current flowing through the discharge path at the time when ESD is applied is not decreased. Therefore, the current density in the discharge path at the time when ESD is applied becomes higher, which causes fusing of the metal interconnection.

Furthermore, in the case of the configuration shown in FIG. 1, a circuit area is large. In the circuit shown in FIG. 1, a width of a metal interconnection of the discharge path 100 may be enlarged in order to reduce the current density and the interconnect resistance. However, as described above, the tap interconnection 5 from the T-coil section 10 to the ESD protection element section 20 is drawn only from the single point, the center tap A in the inductor section 11. Therefore, routing of a metal interconnection (tap interconnection 5) from the single center tap A to both of the ESD protection elements ESD_V and ESD_G is required. In this case, the metal interconnect path becomes complicated and the metal interconnect length becomes large. If the width of the metal interconnection is enlarged, further metal area needs to be ensured, which results in increase in an area of the ESD protection element section 20.

Moreover, the large metal area of the tap interconnection 5 to the two ESD protection elements ESD_V and ESD_G causes loss of the inductance values of the two inductors L1 and L2 of the T-coil section 10. Therefore, a larger inductor area is required in order to achieve the design parameters of the T-coil section 10, which results in increase in an area of the T-coil section 10. As described above, the miniaturization of the CMOS process is progressing, and an area of a CMOS circuit is getting smaller. However, the inductor of the T-coil section 10 and the ESD protection element section 20 hardly enjoy the benefit of the miniaturization of the CMOS process.

SUMMARY

In one embodiment of the present invention, two ESD protection elements are respectively connected to different two nodes in an inductor of a T-coil. Specifically, a semiconductor device according to the present invention has: a signal pad; a power supply line; a ground line; an inductor section whose one end is connected to the signal pad; a terminating resistor connected between the other end of the inductor section and the power supply line or the ground line; a first ESD protection element connected to a first node in the inductor section; and a second ESD protection element connected to a second node whose position is different from that of the first node in the inductor section.

According to the semiconductor device of the present invention, the two ESD protection elements are respectively connected to the different two nodes in the inductor section. Therefore, there is no need to provide a bridge interconnection connecting between the two ESD protection elements. As a result, an interconnect length of the tap interconnection is reduced.

According to the present invention, it is possible to reduce an interconnect resistance of a metal interconnection of an ESD discharge path and to increase a permissible value of the current density. Thus, the semiconductor device with excellent ESD protection ability can be achieved.

Moreover, according to the present invention, it is possible to reduce a formation area of the inductor section and the ESD protection elements.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

(First Embodiment)

Figure 3:
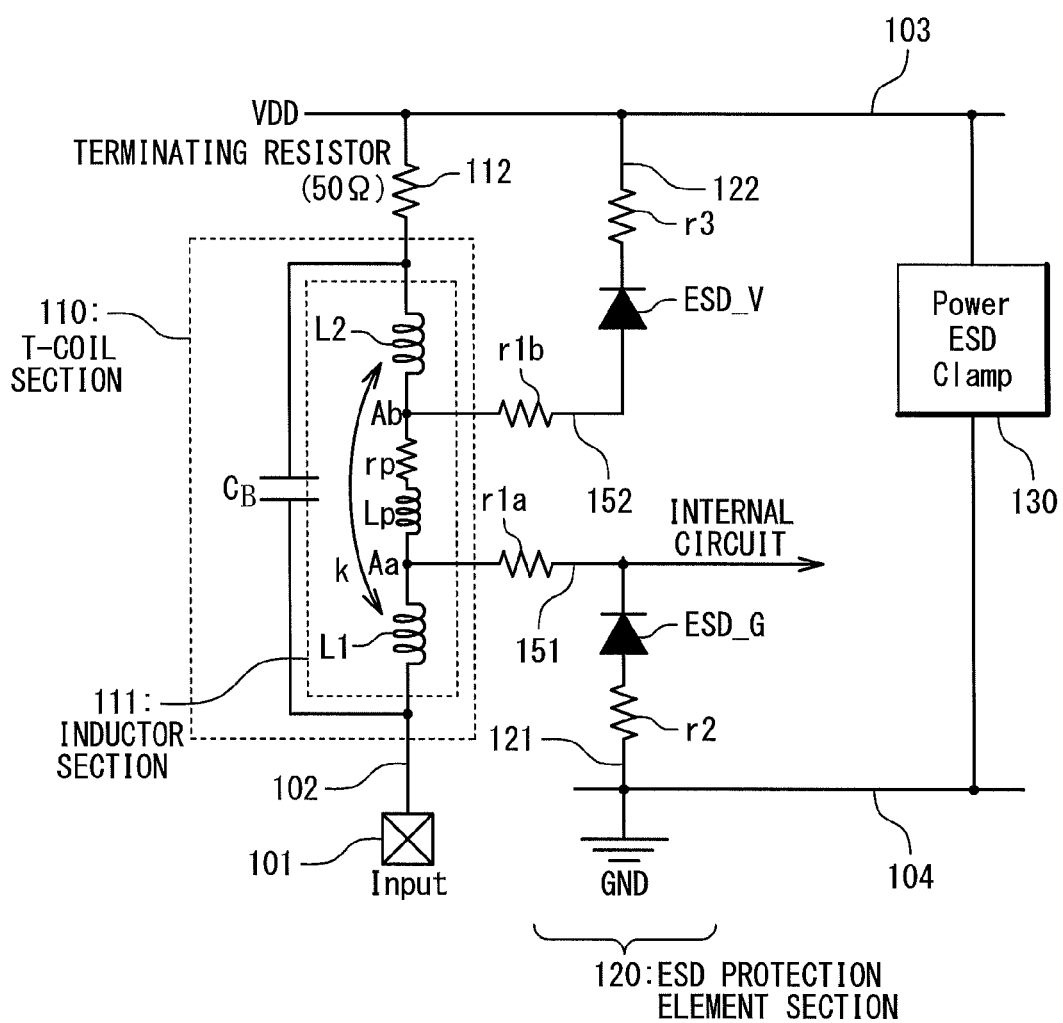
FIG. 3 is a circuit diagram showing an interface circuit provided with a T-coil and an ESD protection element according to a first embodiment.

A semiconductor device according to a first embodiment of the present invention will be described below. FIG. 3 is a circuit diagram showing an interface circuit as the semiconductor device provided with a T-coil and an ESD protection element according to the present embodiment.

The interface circuit shown in FIG. 3 has a signal input pad 101, a signal line 102, a power supply line 103, a ground line 104, tap interconnections 151 and 152, a T-coil section 110, a terminating resistor 112, an ESD protection element section 120 and a power ESD clamp circuit 130. The power supply line 103 supplies a power supply potential VDD. The ground line 104 supplies a ground potential GND.

The signal input pad 101 is used for inputting an external signal. The signal line 102 connected to the signal input pad 101 transmits the input signal. The T-coil section 110 has an inductor section 111 and a capacitor $C_B$. The inductor section 111 has an inductor L1 and an inductor L2. The capacitor $C_B$ is a bridging capacitor of the inductor section 111. A parameter "k" is a coupling coefficient between the inductors L1 and L2. One end of the inductor L1 is connected to the signal line 102, and the other end thereof is connected to a tap node Aa. One end of the inductor L2 is connected to the terminating resistor 112, and the other end thereof is connected to a tap node Ab. The tap nodes Aa and Ab are provided at different positions between the inductor L1 and the inductor L2 in the inductor section 111, and are connected to each other. The tap interconnection 151 is connected to the tap node Aa. The tap interconnection 152 is connected to the tap node Ab. The tap interconnections 151 and 152 connect the T-coil section 110 and the ESD protection element section 120. Parameters "Lp" and "rp" respectively are a parasitic inductance and a parasitic resistance between the tap node Aa and the tap node Ab. One end of the terminating resistor 112 is connected to the inductor section 111, and the other end thereof is connected to the power supply line 103. It should be noted that the terminating resistor 112 may be connected to the ground line 104 instead of the power supply line 103.

The ESD protection element section 120 has an ESD protection element ESD_G (hereinafter referred to simply as ESD_G) and an ESD protection element ESD_V (hereinafter referred to simply as ESD_V). One end of the ESD_G is connected to the ground line 104 through an interconnection 121, and the other end thereof is connected to the tap interconnection 151. One end of the ESD_V is connected to the power supply line 103 through an interconnection 122, and the other end thereof is connected to the tap interconnection 152. Furthermore, an internal circuit is electrically connected to the tap interconnection 151. Note that the internal circuit may be connected to the tap interconnection 152 instead of the tap interconnection 151, or the internal circuit may be connected to both of the tap interconnections 151 and 152.

The power ESD clamp circuit 130 is connected between the power supply line 103 and the ground line 104. Let r1$a$, r1$b$, r2 and r3 be respective parasitic resistances of the tap interconnection 151, the tap interconnection 152, the interconnection 121 and the interconnection 122.

According to the present embodiment, as shown in FIG. 3, two separate tap nodes Aa and Ab are provided in the inductor section 111 of the T-coil section 110, and the tap nodes Aa and Ab are respectively connected to the ESD_G and the ESD_V. Since the tap interconnections 151 and 152 connecting the ESD_G and ESD_V are respectively drawn from the two separate tap nodes Aa and Ab, it is possible to connect the inductor section 111 and the ESD protection element section 120 with a shorter distance as compared with the case shown in FIG. 1 where the single center tap A is used. Moreover, there is no need to provide a bridge interconnection connecting between the ESD_V and the ESD_G. As a result, a metal interconnect length can be reduced.

Figure 4:
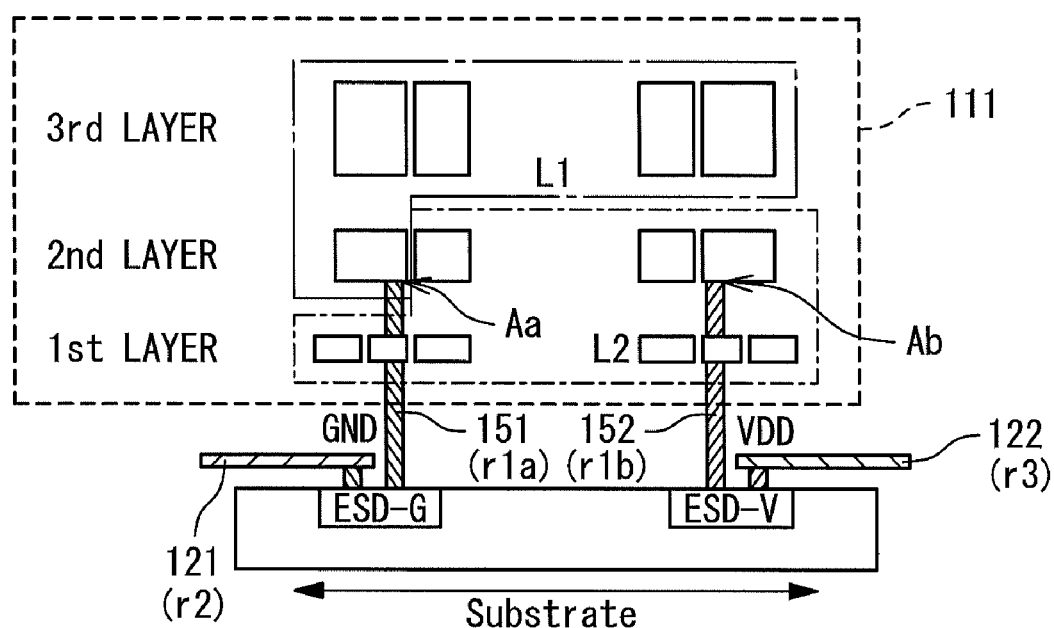
FIG. 4 is a cross-sectional view showing a structure of a semiconductor device according to the first embodiment.

Next, a structure of the semiconductor device according to the present embodiment will be described with reference to FIG. 4 and FIGS. 5A to 5D. FIG. 4 is a cross-sectional view showing a structure of the semiconductor device according to the present embodiment. FIGS. 5A to 5D are plan views showing the structure of the semiconductor device according to the present embodiment. FIG. 4 shows cross-section taken along a line C-C' in FIGS. 5A to 5D.

The inductor section 111 of the T-coil section 110 according to the present embodiment has a multilayer structure. As an example, let us consider a case where the inductor section 111 is formed in three layers. It should be noted that the number of interconnect layers used for forming the inductor section 111 is not limited to three. The inductor section 111 may be formed in a more number or a less number of interconnect layers.

As shown in FIG. 4, the inductor section 111 has a three-layer structure. That is, the inductor section 111 is formed in three interconnect layers from a first layer as the bottom layer to a third layer as the top layer. The inductor L1 is formed in the third layer and a part of the second layer, and the inductor L2 is formed in the first layer and a part of the second layer. The tap nodes Aa and Ab that are connection points for the respective tap interconnections 151 and 152 are provided in the second layer. In the example shown in FIG. 4, vias are formed as the tap interconnections 151 and 152, respectively. Specifically, the respective vias are so formed as to extend from the tap nodes Aa and Ab through the first layer to the ESD_G and the ESD_V formed on a substrate. Thus, the respective vias as the tap interconnections 151 and 152 connect between the inductor section 111 and the ESD protection element section 120. As described above, the tap node Aa and the ESD_G are connected with each other through the tap interconnection 151, and the tap node Ab and the ESD_V are connected with each other through the tap interconnection 152. The positions of the tap node Aa and the tap node Ab are determined based on design parameters of the T-coil section 110 and layout of the inductor section 111 and the ESD protection element section 120. In this manner, the two separate tap nodes Aa and Ab in the inductor section 111 are respectively connected to the ESD_G and the ESD_V of the ESD protection element section 120 through the vias as the tap interconnections 151 and 152.

In order to reduce an area of the ESD protection element section 120 and the inductor section 111, the ESD_V and the ESD_G on the substrate are formed under the inductor section 111. In other words, at least a part of the ESD_G and a part of the ESD_V are so formed as to overlap with the inductor section 111. The ESD_G formed on the substrate is connected to the ground line 104 through a metal interconnection 121 outside of the T-coil section 110. The ESD_V formed on the substrate is connected to the power supply line 103 through a metal interconnection 122 outside of the T-coil section 110.

As shown in FIG. 4, the inductor L1 is formed on the upper layer side (in the third layer and a part of the second layer) and the inductor L2 is formed on the lower layer side (in the first layer and a part of the second layer) in the inductor section 111. This configuration is preferable in that a permissible value of the current density for the inductor L1 becomes higher than that for the inductor L2. In general, as shown in FIG. 4, the upper layer interconnection is formed thicker than the lower layer interconnection. In practice, for example, the upper layer interconnection is formed about two to eight times thicker than the lower layer interconnection. The upper layer interconnection and the lower layer interconnection both are formed of the same material such as Cu, and the permissible value of the current density is higher and the interconnect sheet resistance is lower in the upper layer interconnection than in the lower layer interconnection. As shown in FIG. 3, the inductor L2 is connected in series with the terminating resistor 112 (50Ω). Whereas, a resistance value of the ESD discharge path (Input→L1→ESD_V→VDD) is usually less than a few Ω. Therefore, the ESD current hardly flows through the inductor L2. On the other hand, the inductor L1 is always included in the ESD discharge path. Since the permissible value of the current density in the inductor L1 is higher than that in the inductor L2, the interconnection fusing and the voltage increase due to the ESD current can be effectively suppressed. In the semiconductor device according to the present embodiment, as described above, the inductor L1 is formed in the thick upper interconnect layer. Thus, the permissible value of the current density in the inductor L1 is increased and the interconnect parasitic resistance is reduced.

Figure 5A:
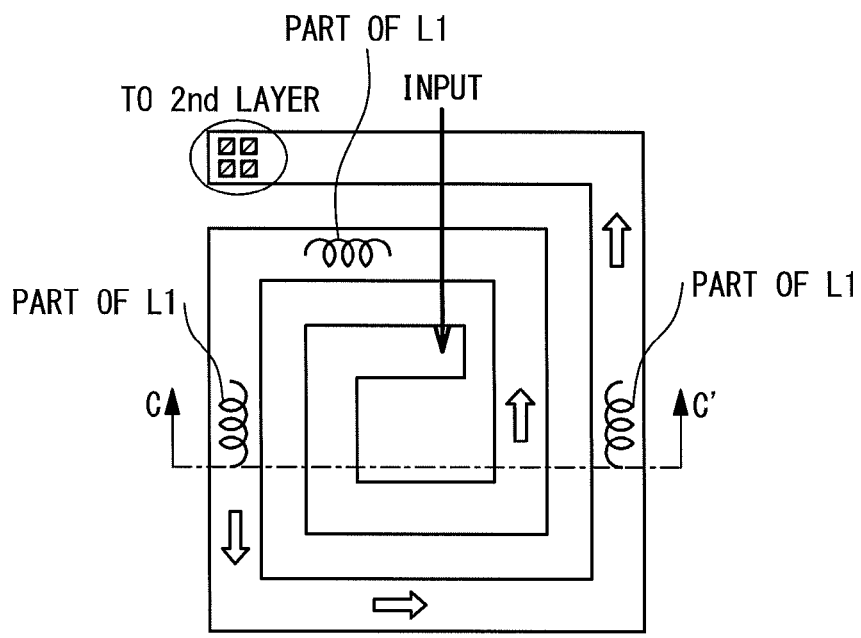
FIG. 5A is a plan view showing a layout of an inductor section 111 in a third layer shown in FIG. 4.
Figure 5B:
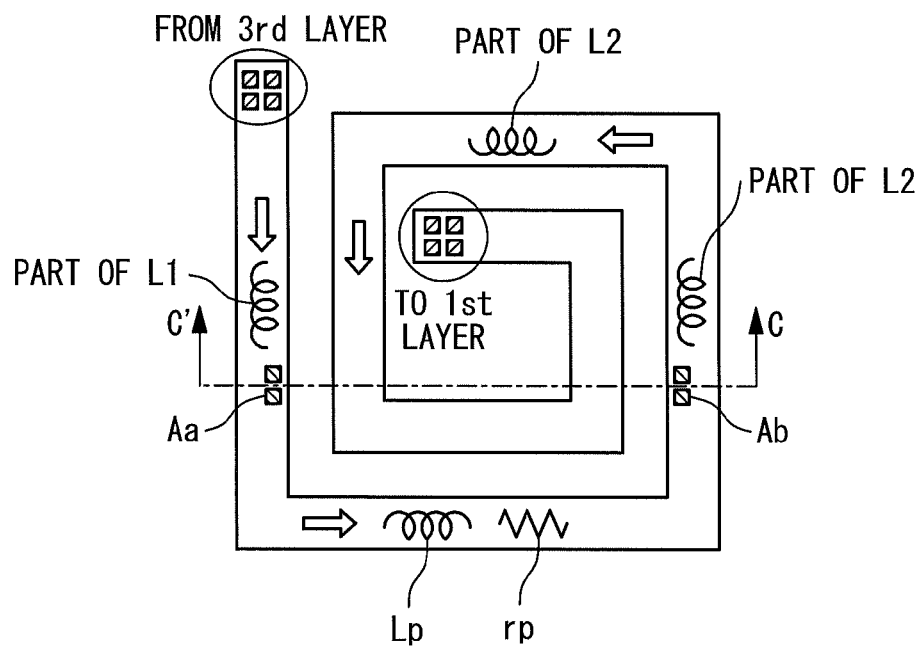
FIG. 5B is a plan view showing a layout of the inductor section 111 in a second layer shown in FIG. 4.
Figure 5C:
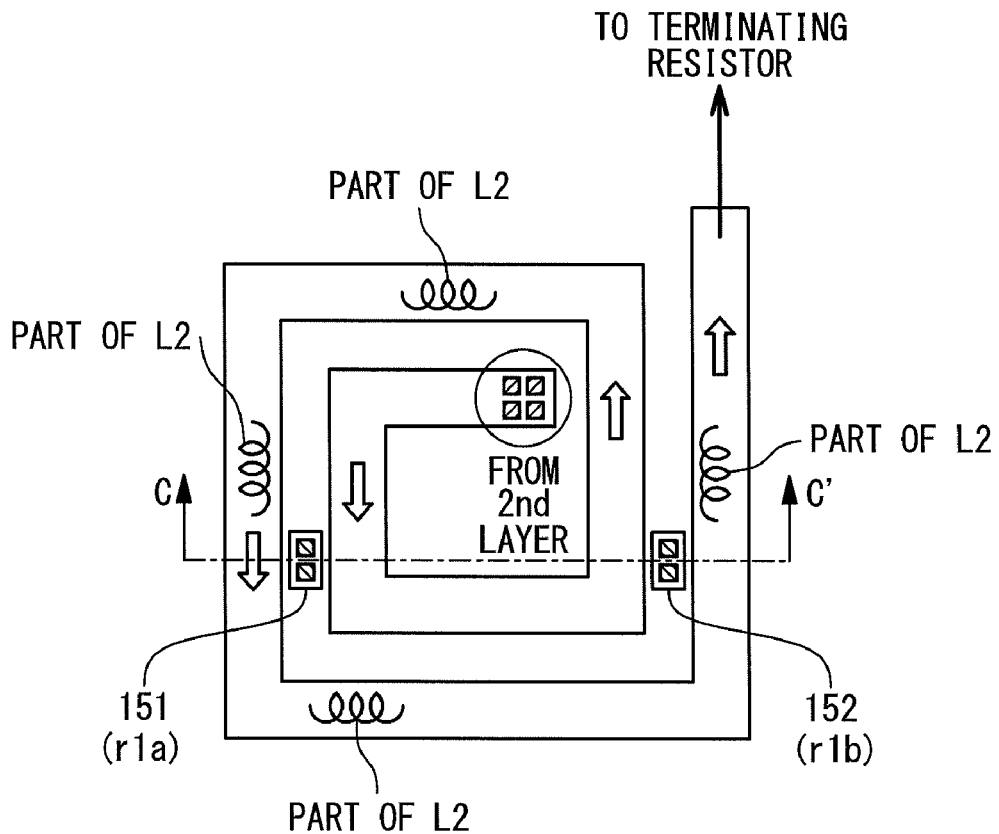
FIG. 5C is a plan view showing a layout of the inductor section 111 in a first layer shown in FIG. 4.

FIGS. 5A to 5C are plan views showing the structure of the inductor section 111 in the respective interconnect layers according to the present embodiment. FIG. 5A shows a layout of the inductor section 111 in the third layer shown in FIG. 4. As shown in FIG. 5A, the metal interconnection of the inductor section 111 is formed in a spiral shape. The same applies to the other layers. In the third layer, the metal interconnection of the inductor section 111 has nine segments. As described above, the metal interconnection formed in the thick third layer is a part of the inductor L1. The signal input pad 101 is connected to an inner-side end of the metal interconnection in the third layer. A via connected to the second layer is formed on an outer-side end of the metal interconnection in the third layer. Alternatively, it is also possible that the signal input pad 101 is connected to the outer-side end and the via connected to the second layer is formed on the inner-side end. This depends on a layout of the semiconductor device.

FIG. 5B shows a layout of the inductor section 111 in the second layer shown in FIG. 4. As in the case of the third layer, the metal interconnection in the second layer also is formed in a spiral shape. In the second layer, the metal interconnection of the inductor section 111 has eight segments. The via connected to the third layer is formed on an outer-side end of the metal interconnection in the second layer. A via connected to the first layer is formed on an inner-side end of the metal interconnection in the second layer. Moreover, in the second layer, the tap node Aa is provided on the first segment from the outer-side end, and the tap node Ab is provided on the third segment from the outer-side end. The tap node Ab is located closer to the inner-side end of the metal interconnection along the metal interconnection than the tap node Aa. A section between the outer-side end and the tap node Aa contributes to the inductor L1, and a section between the inner-side end and the tap node Ab contributes to the inductor L2. In this manner, the inductor section 111 is sectioned into the inductors L1 and L2 by the tap nodes Aa and Ab. There is some distance between the tap node Aa and the tap node Ab, and the parasitic resistance rp and the parasitic inductance Lp are caused between the tap nodes Aa and Ab.

Here, a method of determining the positions of the tap nodes Aa and Ab will be described. The design parameters of the T-coil are calculated in the same manner as described before (refer to the above-mentioned Non-Patent Document 2). That is, the design parameters (the inductances of the inductors L1 and L2, the bridging capacitor $C_B$ and the coupling coefficient k) of the T-coil are calculated by using the above-mentioned Equation (1). Next, the layout of the inductor section 111 and the position of the center tap are determined such that the calculated design parameters are achieved. After that, the respective positions of the tap node Aa and the tap node Ab are determined to be a predetermined distance away from the position of the center tap. The tap nodes Aa and Ab are provided for improving ESD protection ability and facilitating connection to the ESD protection elements. It should be noted that in the present embodiment, as shown in FIG. 5B, a distance between the tap node Aa and the tap node Ab is about one segment of the metal interconnection forming the inductor section 111. In this manner, the positions of the tap node Aa and the tap node Ab in the inductor section 111 are determined in the present embodiment.

In the present embodiment, as described above, the tap nodes Aa and Ab are laid-out to be apart from each other. Therefore, the parasitic resistance rp and the parasitic inductance Lp are caused between the tap nodes Aa and Ab. Here, let us evaluate influence of the parasitic resistance rp and the parasitic inductance Lp between the tap nodes Aa and Ab on the inductances of the inductors L1 and L2. In the present embodiment, as described above, the inductor section 111 has the multilayer structure and is formed in the spiral shape in each interconnect layer. As shown in FIGS. 5A to 5C, the metal interconnection of the inductor section 111 has a total of 25 segments over the first to the third layers. Meanwhile, a distance between the tap node Aa and the tap node Ab is about one segment. Therefore, the influence of the parasitic resistance rp and the parasitic inductance Lp between the tap nodes Aa and Ab on the inductances of the inductors L1 and L2 is about 4% (=1/25). Thus, the influence on the circuit characteristics is negligible.

FIG. 5C shows a layout of the inductor section 111 in the first layer shown in FIG. 4. As in the cases of the third and second layers, the metal interconnection in the first layer also is formed in a spiral shape. In the first layer, the metal interconnection of the inductor section 111 has eight segments. The via connected to the second layer is formed on an inner-side end of the metal interconnection in the first layer. An outer-side end of the metal interconnection is connected to the terminating resistor 112 (not shown). As described above, the metal interconnection formed in the thin first layer is a part of the inductor L2, and the outer-side end of the metal interconnection in the first layer corresponds to the end of the inductor L2. Moreover, islands serving as the paths of the tap interconnections 151 and 152 are provided at positions overlapping with the tap nodes Aa and Ab in the second layer. The islands are so formed as to be apart from the inductor L1 in the first layer. The respective islands connect between the vias connected to the tap nodes Aa and Ab in the second layer and vias connected to the ESD_G and the ESD_V formed on the substrate.

Figure 5D:
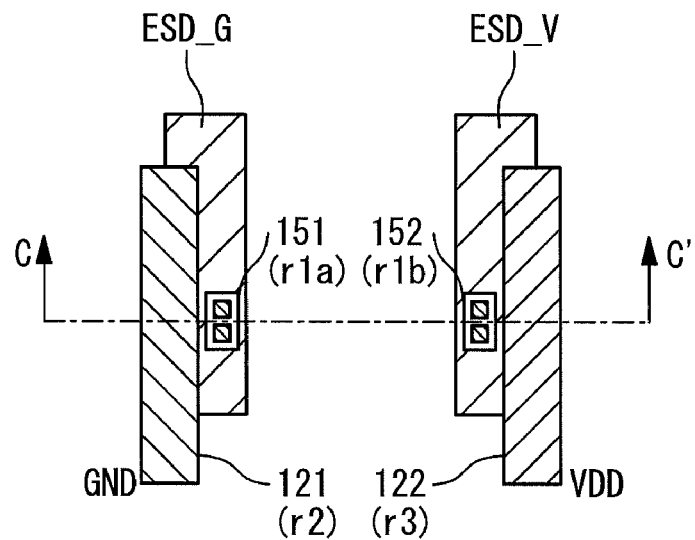
FIG. 5D is a plan view showing a layout of the bottom layer on a substrate shown in FIG. 4.

FIG. 5D is a plan view showing a layout of the bottom layer on the substrate shown in FIG. 4. The ESD_V and the ESD_G are formed on the substrate. In the bottom interconnect layer, the interconnection 121 connected to the ground line 104 and the interconnection 122 connected to the power supply line 103 are formed. The ESD_G is connected to the interconnection 121 through a via (see FIG. 4). The ESD_V is connected to the interconnection 122 through a via (see FIG. 4). Moreover, the via as the tap interconnection 151 extending from the second layer is connected to the ESD_G at a position overlapping with the above-mentioned island in the first layer. Similarly, the via as the tap interconnection 152 extending from the second layer is connected to the ESD_V at a position overlapping with the above-mentioned island in the first layer. The ESD_G and the ESD_V are respectively connected to the tap node Aa and the tap node Ab through the vias.

According to the semiconductor device of the present embodiment, as described above, the tap node Aa and the tap node Ab are provided at different positions of the inductor section 111 in the second layer, and the ESD_G and the ESD_V formed on the substrate are respectively connected to the tap nodes Aa and Ab through the vias as the tap interconnections 151 and 152. As a result, there is no need to form a bridge interconnection connecting between the ESD_G and the ESD_V. Moreover, since the tap interconnections 151 and 152 are so formed as to extend in a vertical direction by using the vias, the ESD current also flows in the vertical direction from the inductor section 111 formed in the upper interconnect layer to the ESD protection element section 120 formed on the substrate. To make the ESD current path in the vertical direction has big advantage. With increasing miniaturization of the CMOS process, the interconnect thickness is getting smaller. However, when the current path is in the vertical direction, it is possible to increase the permissible value of the current density and to reduce the parasitic resistances r1a and r1b, regardless of the interconnect thickness. The reason is that the permissible value of the current density and the parasitic resistance depends on a cross-sectional area through which a current flows, and the permissible value of the current density increases and the parasitic resistance per unit length decreases with increasing cross-sectional area. As an example, let us consider a case where the interconnect thickness is about 0.1 μm, the interconnect width is about 10 μm, and a width of a via is about 10 μm. When a current flows in a horizontal direction, the cross-sectional area is 0.1 μm×10 μm=1 (μm)². On the other hand, when a current flows in a vertical direction, the cross-sectional area is 10 μm×10 μm=100 (μm)², which is 100 times larger than in the case of the horizontal direction. That is, the permissible value of the current density becomes 100 times higher, and the parasitic resistance value becomes 1/100.

Figure 1:
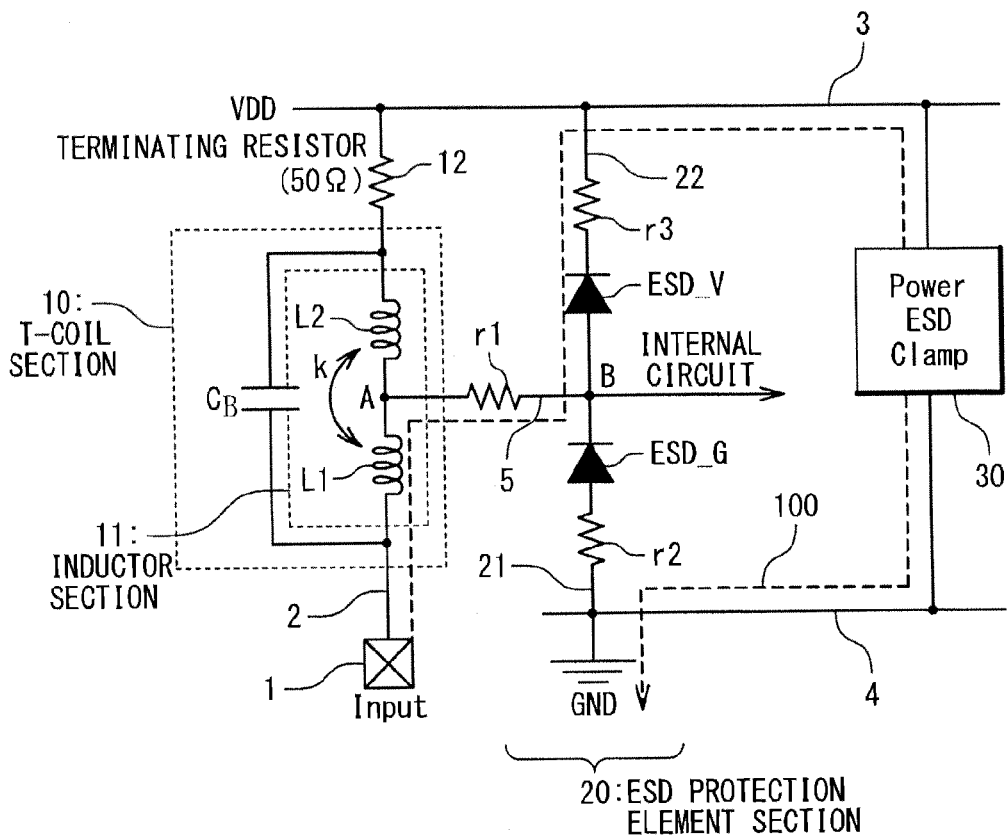
FIG. 1 is a circuit diagram showing a typical interface circuit provided with a T-coil and an ESD protection element.
Figure 2:
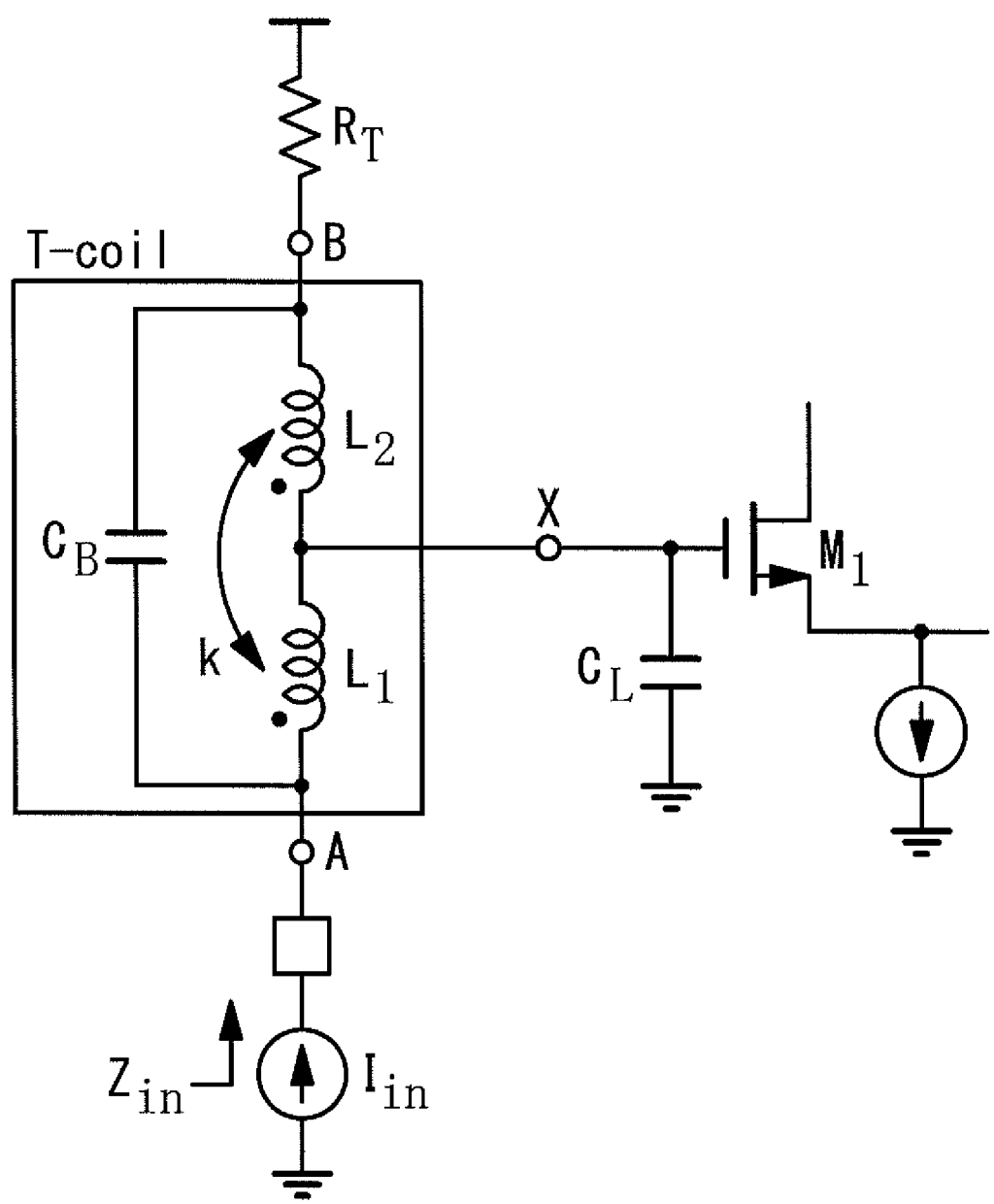
FIG. 2 is a circuit diagram showing a typical interface circuit provided with a T-coil and a terminating resistor.
Figure 6:
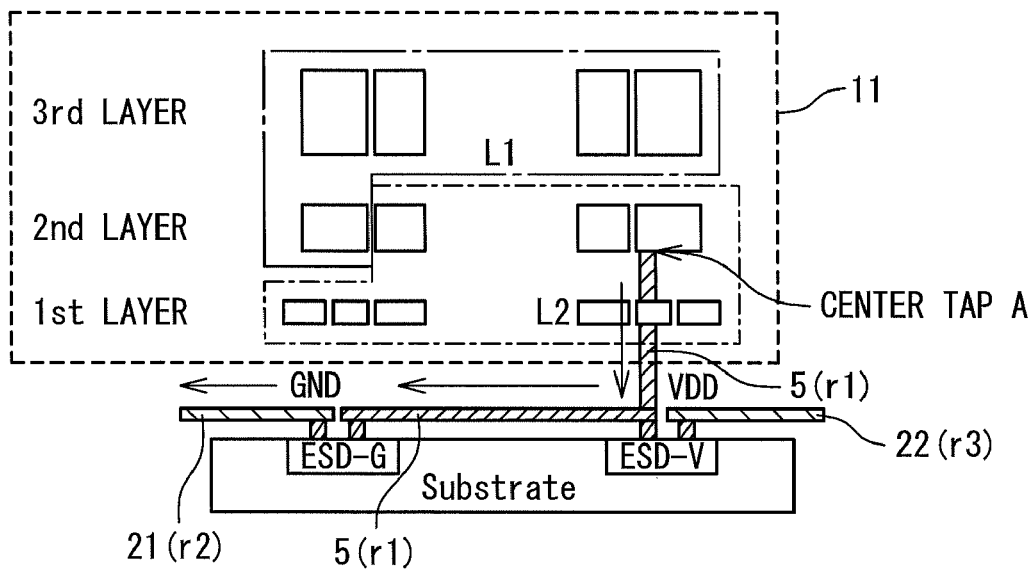
FIG. 6 is a cross-sectional view showing a structure of a semiconductor device according to a comparative example.
Figure 7:
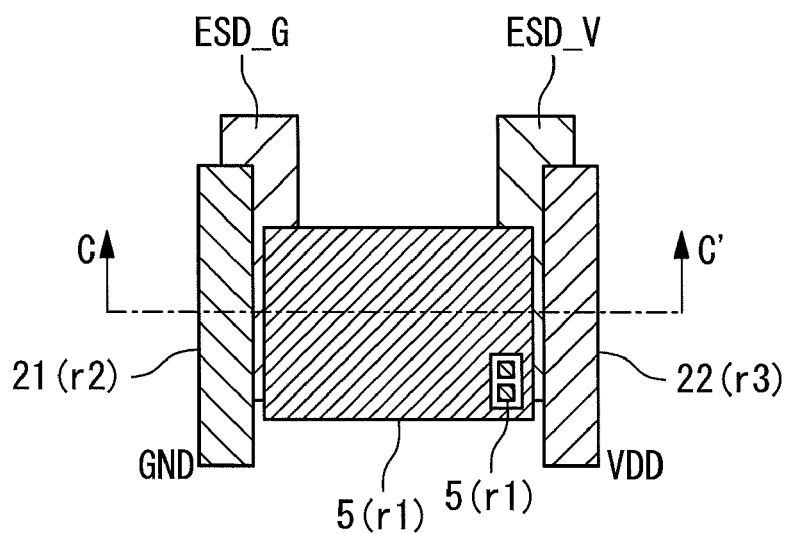
FIG. 7 is a plan view showing a layout of the bottom layer on a substrate according to the comparative example shown in FIG. 6.

Here, let us consider a comparative example where the tap interconnection 5 is drawn only from the single center tap A as in the case of FIG. 1. FIG. 6 is a cross-sectional view showing a structure of the semiconductor device according to the comparative example. FIG. 7 is a plan view showing a layout of the bottom layer on the substrate according to the comparative example shown in FIG. 6. FIG. 6 shows cross-section taken along a line C-C' in FIG. 7.

As shown in FIG. 6, the center tap A is formed in the inductor section 11 in the second layer. A via as the tap interconnection 5 is formed from the center tap A through the first layer to the ESD_V formed on the substrate. The via as the tap interconnection 5 connects between the center tap A and the ESD_V. Furthermore, a bridge interconnection 5 connecting between the ESD_V and the ESD_G is formed in the bottom interconnect layer. The via connecting between the center tap A and the ESD_V is connected to the bridge interconnection 5. In this manner, the center tap A is connected to both of the ESD_V and the ESD_G. In the case of the comparative example, the ESD current flows in a horizontal direction through the bridge interconnection 5. Therefore, a wide metal interconnection as shown in FIG. 7 is required for reducing its resistance value. In the case where such the wide and large metal interconnection is laid-out immediately below the inductors L1 and L2, the inductances of the inductors L1 and L2 are greatly reduced. The reason is that the inductor section 11 is magnetically coupled to the nearby metal interconnection and inductance loss is caused by an undesired current. For example, although the T-coil section 10 is designed such that L1=0.45 nH and L2=0.42 nH, the bridge interconnection 5 being laid-out below the T-coil section 10 causes great reduction in the inductance values such as L1=0.3 nH and L2=0.15 nH. In order to increase the inductance values to the design values, the inductors need to be made larger, which causes increase in an area of the T-coil section 10.

Moreover, the bottom interconnect layer in which the bridge interconnection 5 is formed is a thin film metal layer whose sheet resistance is high and whose permissible value of the current density is low. It is therefore necessary to make the bridge interconnection 5 wide enough to endure the ESD current. As shown in FIG. 7, the bridge interconnection 5 is so formed as to be wide. In this case, however, the resistance value r1 becomes higher, which causes considerable voltage increase at the time when ESD is applied, resulting in breakdown of the internal circuit. Moreover, the large metal interconnection immediately below the inductor deteriorates the inductor ability.

On the other hand, according to the present embodiment, as described above, the tap node Aa and the tap node Ab are provided at different positions of the inductor section 111 in the second layer, and the ESD_G and the ESD_V formed on the substrate are respectively connected to the tap nodes Aa and Ab. As a result, there is no need to form the bridge interconnection connecting between the ESD_G and the ESD_V, and the interconnect lengths of the tap interconnections 151 and 152 can be reduced.

Moreover, since the influence of the wide bridge interconnection on the inductor section 111 is eliminated, it is possible to prevent the increase in the area of the T-coil section 110 and the deterioration of the ability of the inductors L1 and L2.

In the present embodiment, the ESD protection element section 120 including the ESD_G and the ESD_V is formed immediately below the inductor section 111. To form the ESD protection element section 120 below the inductor section 111 as in the present embodiment is effective for reducing the area required for the T-coil section 110 and the ESD protection element section 120. However, it is not necessarily required to form the whole of the ESD protection element section 120 immediately below the inductor section 111. When at least a part of the ESD_G or a part of the ESD_V is so formed as to overlap with the inductor section 111, the effect of reducing the formation area of the T-coil section 110 and the ESD protection element section 120 can be obtained.

With increasing miniaturization of the CMOS process, the interconnect thickness is getting smaller. It is therefore preferable that the tap interconnections 151 and 152, which respectively connect the tap node Aa and the tap node Ab and the ESD_G and the ESD_V formed on the substrate, are so formed by the vias as shown in FIG. 4 as to extend in the vertical direction with respect to the interconnect layer (a plane in which the metal connection of the inductor section 111 is formed). When the tap interconnections 151 and 152 are formed in the vertical direction, the permissible value of the current density can be increased even in the case of the thin film interconnection. It is therefore possible to prevent deterioration of ability of the ESD protection element section 120 and the inductor section 111.

According to the semiconductor device of the present embodiment, the tap interconnections 151 and 152 connected to the ESD protection elements are respectively drawn from the two tap nodes Aa and Ab of the inductor section 111. Therefore, there is no need to provide a bridge interconnection between the ESD protection elements and the metal interconnect length can be reduced, as compared with the above-described comparative example. The resistance value of the tap interconnection can be suppressed, and thus the fusing of the tap interconnection and the breakdown of the internal circuit can be prevented.

Moreover, the inductor section 111 of the present embodiment has the multilayer structure. The inductor L1 is formed in the upper layer where the interconnect thickness is larger, while the inductor L2 is formed in the lower layer where the interconnect thickness is smaller. It is thus possible to increase the permissible value of the current density in the inductor L1 included in the ESD discharge path.

Furthermore, at least a part of, preferably the whole of the ESD_V and ESD_G formed on the substrate overlaps with the region in which the inductor section 111 is formed. As a result, the area of the T-coil section 110 and the ESD protection element section 120 can be reduced.

It is also preferable that the tap interconnections 151 and 152, which respectively connect the tap node Aa and the tap node Ab and the ESD_G and the ESD_V formed on the substrate, are so formed by the vias as to extend in the vertical direction. When the current path is formed in the vertical direction, it is possible to prevent deterioration of the inductance ability of the inductors L1 and L2 of the inductor section 111.

(Second Embodiment)

Next, a semiconductor device according to a second embodiment of the present invention will be described. In the second embodiment, a structure in which the semiconductor device described in the first embodiment is placed repeatedly will be described. In this case, the interconnection 121 connected to the GND interconnection 104 and the interconnection 122 connected to the VDD interconnection 103 can be shared by adjacent semiconductor devices. The permissible value of the current density can be increased by enlarging the interconnect widths of the interconnections 121 and 122.

Figure 8:
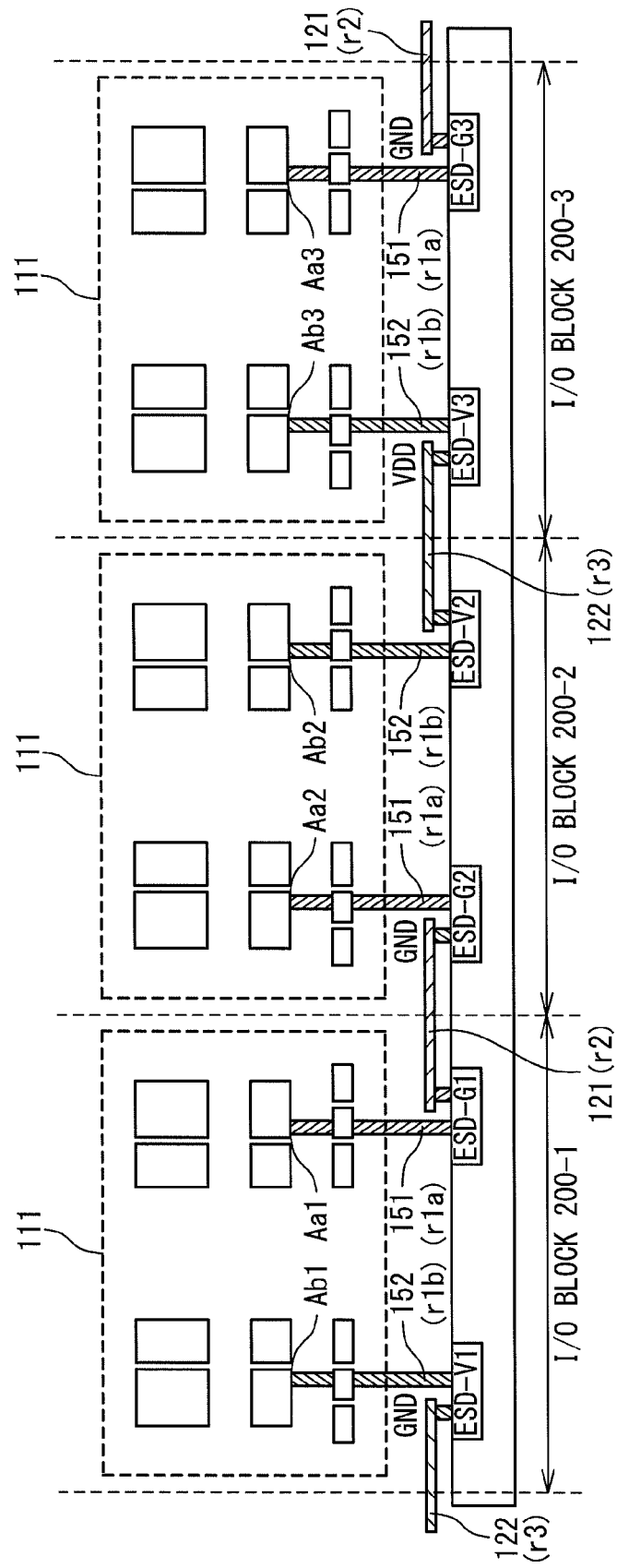
FIG. 8 is a cross-sectional view showing a structure of a semiconductor device according to a second embodiment.
Figure 9:
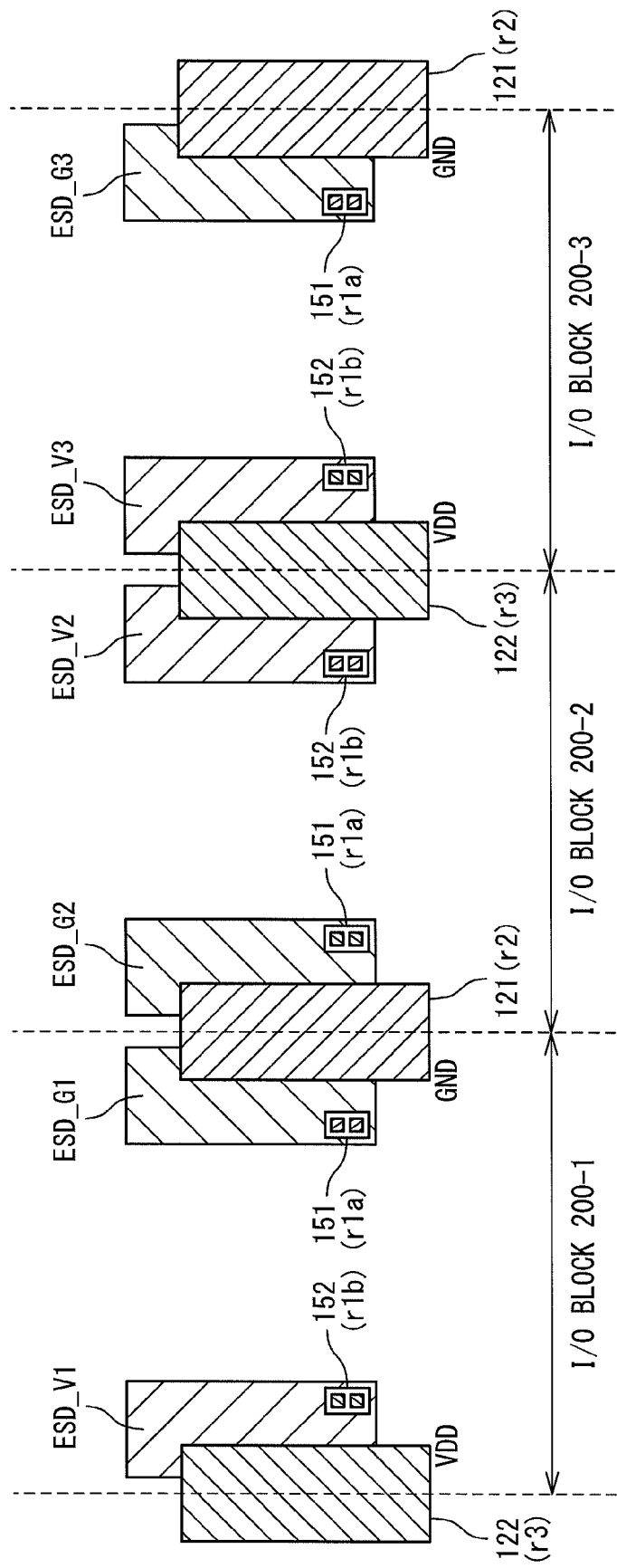
FIG. 9 is a plan view showing a layout of the bottom layer on a substrate shown in FIG. 8.
Figure 10:
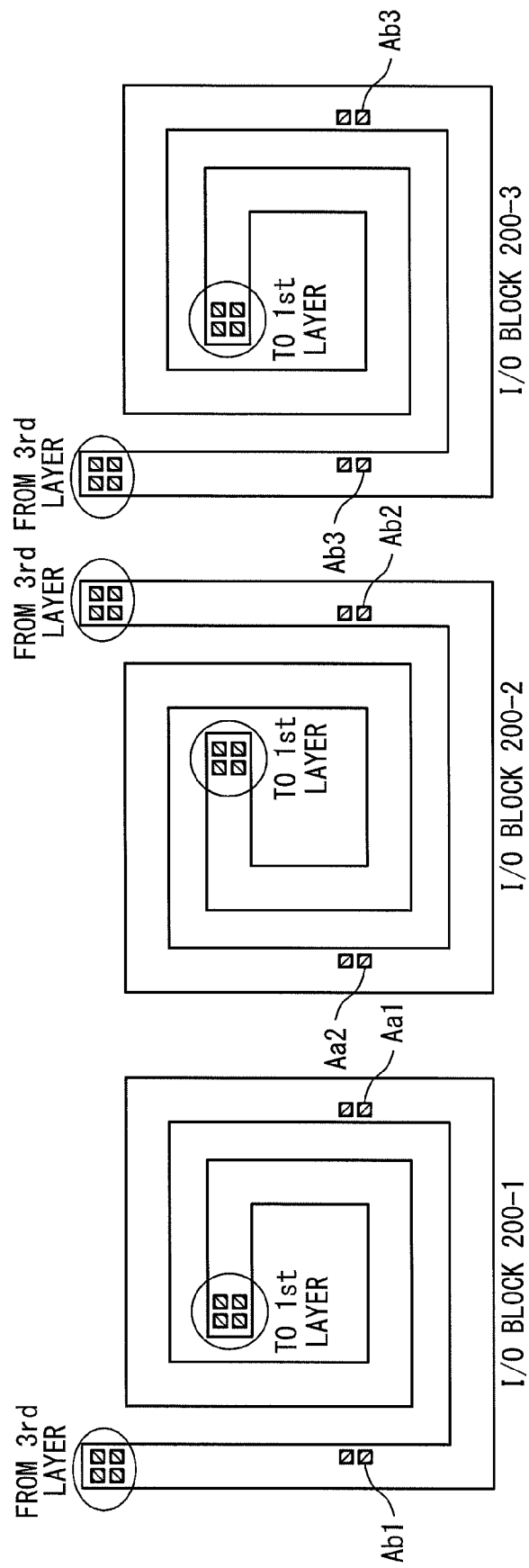
FIG. 10 is a plan view showing a layout of the inductor section 111 in a second layer shown in FIG. 8.

FIG. 8 is a cross-sectional view showing a structure of the semiconductor device according to the present embodiment. FIGS. 9 and 10 are plan views of the semiconductor device according to the present embodiment. FIG. 9 is a plan view showing a layout of the bottom layer on the substrate shown in FIG. 8. FIG. 10 is a plan view showing a layout of the inductor section 111 in the second layer shown in FIG. 8.

As shown in FIG. 8, I/O blocks 200-1 to 200-3 are formed. Each of the I/O blocks 200-1 to 200-3 is the same semiconductor device as described in the first embodiment. One signal input terminal corresponds to one I/O block 200 in the present embodiment. As shown in FIG. 8, each I/O block 200 includes the inductor section 111 having the multilayer structure as in the case of the first embodiment. In the each I/O block 200, the ESD protection element section 120 (ESD_V, ESD_G) is so formed as to overlap with the formation region of the inductor section 111. According to the present embodiment, the respective ESD_V of the adjacent I/O blocks 200 are so formed as to be adjacent to each other on the substrate. Also, the respective ESD_G of the adjacent I/O blocks 200 are so formed as to be adjacent to each other on the substrate. That is, the ESD_G1 of the I/Oblock 200-1 and the ESD_G2 of ESD_G2 of the I/O block 200-2 are so formed as to be adjacent to each other, and the ESD_V2 of the I/O block 200-2 and the ESD_V3 of the I/O block 200-3 are so formed as to be adjacent to each other. When there exists an I/O block 200-x adjacent to the I/O block 200-1, the ESD_V1 of the I/Oblock 200-1 and the ESD_Vx of the I/O block 200-x are so formed as to be adjacent to each other. Similarly, when there exists an I/O block 200-x adjacent to the I/O block 200-3, the ESD_G3 of the I/O block 200-3 and the ESD_Gx of the I/O block 200-x are so formed as to be adjacent to each other.

As shown in FIG. 10, in each I/O block 200, the tap nodes Aa and Ab are formed in the inductor section 111 in the second layer. Moreover, the respective tap nodes Aa of the adjacent I/O blocks 200 are so provided as to be adjacent to each other. Similarly, the respective tap nodes Ab of the adjacent I/O blocks 200 are so provided as to be adjacent to each other. Moreover, in each I/O block 200, the inductor L1 is formed in the upper interconnect layer where the interconnect thickness is large, and the permissible value of the current density in the inductor L1 can be increased.

According to the present embodiment, the interconnection 121 connected to the GND interconnection 104 is shared by adjacent I/O blocks 200. Also, the interconnection 122 connected to the VDD interconnection 103 is shared by adjacent I/O blocks 200. As shown in FIG. 8, the interconnection 121 connected to the GND interconnection 104 is shared by the I/O block 200-1 and the I/O block 200-2. Also, the interconnection 122 connected to the VDD interconnection 103 is shared by the I/O block 200-2 and the I/O block 200-3.

Therefore, in the semiconductor device according to the present embodiment, the interconnect widths of the interconnection 121 connected to the GND interconnection 104 and the interconnection 122 connected to the VDD interconnection 103 can be made large. As shown in FIG. 9, the interconnection 121 connected to the GND interconnection 104 or the interconnection 122 connected to the VDD interconnection 103 is shared by the adjacent ESD protection elements 120 of the adjacent I/O blocks 200, and the interconnect width thereof is made large. For example, the interconnect widths of the interconnection 121 and the interconnection 122 can be made twice as large as compared with the case of the first embodiment. As a result, the permissible value of the current density of the power supply line 103 and the ground line 104 included in the discharge path can be increased.

Overlapping description with the first embodiment will be omitted as appropriate. According to the semiconductor device of the present embodiment, the respective ESD_G of the ESD protection element sections 120 of the adjacent I/O blocks 200 are laid-out to be adjacent to each other. Due to this configuration, the interconnection 121 connected to the GND interconnection 104 and formed in the bottom interconnect layer can be shared by the adjacent I/O blocks 200. The same applies to the ESD_V and the interconnection 122 connected to the VDD interconnection 103. As a result, the interconnect widths of the interconnection 121 connected to the GND interconnection 104 and the interconnection 122 connected to the VDD interconnection 103 can be made large. Thus, the permissible value of the current density in the interconnection 121 connected to the GND interconnection 104 and the interconnection 122 connected to the VDD interconnection 103 can be increased. It goes without saying that the same effects as in the first embodiment can also be obtained.

It should be noted that, in the foregoing embodiments, a single-phase signal is input to an input circuit as the internal circuit connected to the T-coil section 110. The same applies to a case of an output circuit as the internal circuit connected to the T-coil section 110. Moreover, the present invention can be applied to a circuit that handles a differential signal instead of the single-phase signal. For example, an input circuit and an output circuit based on a differential configuration are disclosed in the FIG. 10.5.3 and the FIG. 10.5.4 of the above-mentioned Non-Patent Document 2.

It is apparent that the present invention is not limited to the above embodiments and may be modified and changed without departing from the scope and spirit of the invention.

What is claimed is:

1. A semiconductor device comprising:
   a signal pad;
   a power supply line;
   a ground line;
   an inductor section whose one end is connected to said signal pad;
   a terminating resistor connected between the other end of said inductor section and said power supply line or said ground line;
   a first ESD protection element connected to a first node in said inductor section; and
   a second ESD protection element connected to a second node whose position is different from that of said first node in said inductor section,
   wherein said inductor section comprises:
      a first inductor connected between said signal pad and said first node; and
      a second inductor connected between said terminating resistor and said second node,
   wherein said first node and said second node are connected in series between said first inductor and said second inductor.

2. The semiconductor device according to claim 1, wherein an internal circuit is electrically connected to at least one of said first node and said second node.

3. The semiconductor device according to claim 1, wherein said first ESD protection element is connected between said ground line and said first node.

4. The semiconductor device according to claim 1, wherein said second ESD protection element is connected between said power supply line and said second node.

5. A semiconductor device comprising:
   a signal pad;
   a power supply line;
   a ground line;
   an inductor section whose one end is connected to said signal pad;
   a terminating resistor connected between the other end of said inductor section and said power supply line or said ground line;
   a first ESD protection element connected to a first node in said inductor section; and
   a second ESD protection element connected to a second node whose position is different from that of said first node in said inductor section,
   wherein said inductor section comprises:
      a first inductor connected between said signal pad and said first node; and
      a second inductor connected between said terminating resistor and said second node,
   wherein said inductor section is formed in a plurality of interconnect layers,
   said first inductor is formed in a first interconnect layer of said plurality of interconnect layers,
   said second inductor is formed in a second interconnect layer of said plurality of interconnect layers, and
   an interconnect thickness is larger in said first interconnect layer than in said second interconnect layer.

6. A semiconductor device comprising:
   a signal pad;
   a power supply line;
   a ground line;
   an inductor section whose one end is connected to said signal pad;

a terminating resistor connected between the other end of said inductor section and said power supply line or said round line;
a first ESD protection element connected to a first node in said inductor section; and
a second ESD protection element connected to a second node whose position is different from that of said first node in said inductor section,
wherein said first ESD protection element and said second ESD protection element are formed on a substrate,
at least a part of said first ESD protection element and a part of said second ESD protection element overlap with said inductor section,
said first node and said first ESD protection element are connected with each other through a first via, and
said second node and said second ESD protection element are connected with each other through a second via.

7. The semiconductor device according to claim 1,
wherein said first ESD protection element is connected between said ground line and said first node,
said second ESD protection element is connected between said power supply line and said second node,
an interconnection connecting said first ESD protection element to said ground line is shared by adjacent first ESD protection elements, and
an interconnection connecting said second ESD protection element to said power supply line is shared by adjacent second ESD protection elements.

* * * * *